United States Patent
Araoka et al.

(10) Patent No.: US 10,249,497 B2
(45) Date of Patent: Apr. 2, 2019

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Tsuyoshi Araoka, Tsukuba (JP); Youichi Makifuchi, Tachikawa (JP); Takashi Tsutsumi, Matsumoto (JP); Mitsuo Okamoto, Tsukuba (JP); Kenji Fukuda, Tsukuba (JP)

(73) Assignee: FUJI ELECTRIC CO., LTD., Kawasaki-Shi, Kanagawa ( * ) Notice: Subject to any disclaimer, the term of this patent is extended or adjusted under 35 U.S.C. 154(b) by 0 days.

(21) Appl. No.: 15/691,158

(22) Filed: Aug. 30, 2017

(65) Prior Publication Data
US 2018/0090321 A1    Mar. 29, 2018

(30) Foreign Application Priority Data
Sep. 29, 2016   (JP) .................. 2016-191296

(51) Int. Cl.
| | |
|---|---|
| *H01L 27/148* | (2006.01) |
| *H01L 29/167* | (2006.01) |
| *H01L 21/76* | (2006.01) |
| *H01L 21/04* | (2006.01) |
| *H01L 29/16* | (2006.01) |
| *H01L 29/36* | (2006.01) |
| *H01L 29/51* | (2006.01) |
| *H01L 29/66* | (2006.01) |

(Continued)

(52) U.S. Cl.
CPC .......... *H01L 21/045* (2013.01); *H01L 21/049* (2013.01); *H01L 29/1608* (2013.01); *H01L 29/36* (2013.01); *H01L 29/51* (2013.01); *H01L 29/66068* (2013.01); *H01L 29/66568* (2013.01); *H01L 29/6606* (2013.01); *H01L 29/7802* (2013.01); *H01L 29/94* (2013.01)

(58) Field of Classification Search
CPC ..... H01L 29/36; H01L 29/1608; H01L 29/51; H01L 29/6606; H01L 29/66068; H01L 21/045; H01L 21/049
USPC ........ 438/402, 433, 471, 473; 257/227, 607, 257/611
See application file for complete search history.

(56) References Cited

U.S. PATENT DOCUMENTS

| | | | |
|---|---|---|---|
| 9,812,529 B2 * | 11/2017 | Ohashi | ............... H01L 29/1608 |
| 2005/0245034 A1 | 11/2005 | Fukuda et al. | |

(Continued)

FOREIGN PATENT DOCUMENTS

| | | |
|---|---|---|
| JP | H09-199497 A | 7/1997 |
| JP | 4374437 B2 | 12/2009 |

*Primary Examiner* — Hsien Ming Lee
(74) *Attorney, Agent, or Firm* — Rabin & Berdo, P.C.

(57) ABSTRACT

A silicon carbide semiconductor device includes a silicon carbide semiconductor substrate of a first conductivity type, a gate insulating film provided on a front surface of the silicon carbide semiconductor substrate and including any one or a plurality of an oxide film, a nitride film, and an oxynitride film, and a gate electrode containing poly-silicon and provided on the gate insulating film. A concentration of fluorine in the gate insulating film at an interface with the silicon carbide semiconductor substrate is equal to or higher than $1\times10^{19}$ atoms/cm$^3$.

5 Claims, 6 Drawing Sheets

(51) Int. Cl.
*H01L 29/78* (2006.01)
*H01L 29/94* (2006.01)

(56) References Cited

U.S. PATENT DOCUMENTS

2011/0227139 A1* 9/2011 Kakehata .............. H01L 27/115
257/316
2015/0236098 A1* 8/2015 Shimizu .............. H01L 29/1608
257/77

* cited by examiner

US 10,249,497 B2

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2016-191296, filed on Sep. 29, 2016, the entire contents of which are incorporated herein by reference.

BACKGROUND OF THE INVENTION

1. Field of the Invention

Embodiments of the present invention relate to a silicon carbide semiconductor device and a method of manufacturing a silicon carbide semiconductor device.

2. Description of the Related Art

The research and development of next-generation semiconductor devices using a silicon carbide (SiC) substrate are advancing. Silicon carbide has characteristics that enable formation of an insulating film by thermal oxidation similar to silicon (Si) while channel mobility of a metal oxide semiconductor (MOS) interface (an interface between a gate insulating film and a silicon carbide substrate) differs depending on crystal planes or oxidation methods.

Oxidation methods of silicon carbide include dry oxidation using dry oxygen ($O_2$) as the oxidizing species and wet oxidation using water vapor ($H_2O$) as the oxidizing species. It is considered that a (000-1) plane and a (11-20) plane of a silicon carbide substrate have higher channel mobility than a (0001) plane when wet-oxidized. In the notation of Miller indices in the present specification, "-" is a bar that is added to an index immediately thereafter and an index having "-" added there before represents a negative index. An interface state density is used as an index for alternatively evaluating the channel mobility and a tendency is known that the channel mobility is generally higher when the interface state density is lower.

Regarding such thermal oxidation of silicon carbide, there is a method of improving a thermal oxide film of silicon carbide on a silicon carbide substrate to reduce hysteresis and flat-band shift. This improvement method is characterized in including an annealing process using hydrogen ($H_2$) and an annealing process using inert gas, after thermal oxidation of the silicon carbide substrate in oxygen or humidified oxygen (for example, see Japanese Laid-Open Patent Publication No. H09-199497).

Furthermore, regarding reduction of the interface state density, there is a method of reducing the interface state density by oxidizing a (000-1) plane of a silicon carbide substrate in a wet atmosphere containing $H_2O$ gas and $O_2$ gas or $H_2O$ gas, $O_2$ gas, and inert gas and thereafter thermally treating the (000-1) plane in an atmosphere containing $H_2$ gas (for example, see Japanese Patent No. 4374437).

SUMMARY OF THE INVENTION

According to one aspect of the present invention, a silicon carbide semiconductor device includes a silicon carbide semiconductor substrate of a first conductivity type; a gate insulating film provided on a front surface of the silicon carbide semiconductor substrate and including any one or a plurality of an oxide film, a nitride film, and an oxynitride film; and a gate electrode containing poly-silicon and provided on the gate insulating film. A concentration of fluorine in the gate insulating film at an interface with the silicon carbide semiconductor substrate is equal to or higher than $1\times10^{19}$ atoms/$cm^3$.

In the silicon carbide semiconductor device, a concentration of fluorine in the gate electrode is equal to or lower than $1\times10^{18}$ atoms/$cm^3$.

According to another aspect of the present invention, a method of manufacturing a silicon carbide semiconductor device includes forming on a front surface of a silicon carbide semiconductor substrate, a gate insulating film that includes any one or a plurality of an oxide film, a nitride film, and an oxynitride film; forming on the gate insulating film, a gate electrode containing poly-silicon; ion implanting fluorine in the gate electrode; and diffusing the fluorine to the gate insulating film and an interface between the gate insulating film and the silicon carbide semiconductor substrate by heat treatment.

In the method, forming the gate insulating film includes performing oxidation or heat treatment in an environment containing water vapor or hydrogen.

In the method, ion implanting the fluorine is performed at an acceleration energy of 20 keV to 50 keV and a peak concentration of the fluorine is $1\times10^{19}$/$cm^3$ to $1\times10^{22}$/$cm^3$.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
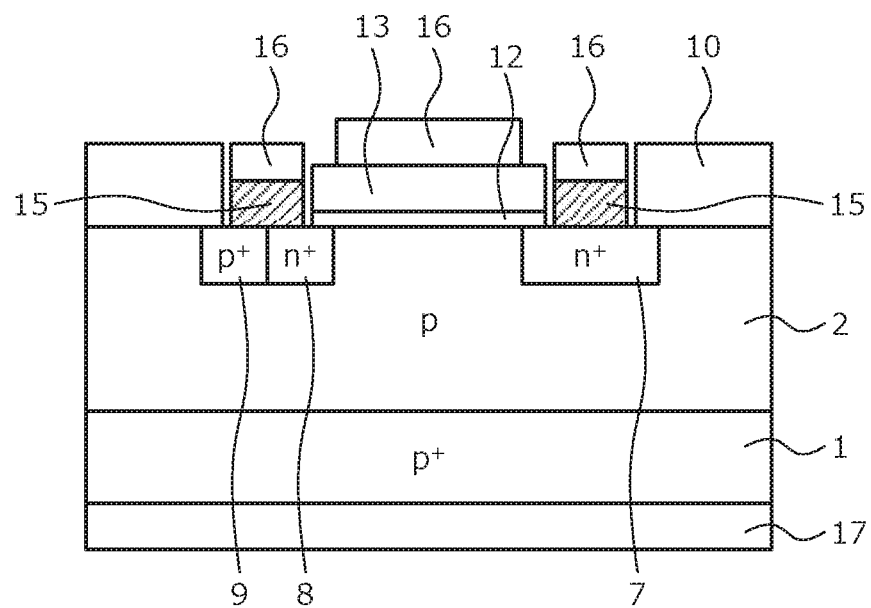
FIG. 1 is a cross-sectional view of a configuration of a MOSFET according to an embodiment.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described.

It is known that the interface state density of a MOS interface obtained by oxidizing the (000-1) plane or the (11-20) plane of a silicon carbide substrate in a wet atmosphere is increased by heat treatment at a subsequent process, which deteriorates the MOS interface characteristics. For example, one such heat treatment is performed at about 800 degrees C. to 1000 degrees C. to form a reactive layer between contact metals and silicon carbide and form ohmic contacts.

It is thought that the interface state density is reduced by oxidation in a wet atmosphere because hydrogen or hydroxyl groups (—OH) terminate the interface state. Therefore, it is presumed that the interface state density is increased by an elimination of the terminating hydrogen or hydroxyl groups by the heat treatment at the subsequent process whereby the MOS interface characteristics deteriorate.

As described above, in the conventional techniques, even when the interface state density of the MOS interface is reduced by wet-oxidizing the (000-1) plane or the (11-20) plane of a silicon carbide substrate, the interface state density is increased by heat treatment at the subsequent process and thus it is difficult to provide a high channel mobility.

In an embodiment, a silicon carbide semiconductor device is described using a configuration of a MOSFET as an example. FIG. 1 is a cross-sectional view of a configuration of a MOSFET according to the embodiment. As depicted in FIG. 1, the MOSFET according to the embodiment includes a p-type epitaxial film 2 deposited on a first main surface (a front surface), for example, a (000-1) plane of a p$^+$-type silicon carbide substrate (a silicon carbide substrate of a first conductivity type) 1.

The p$^+$-type silicon carbide substrate 1 is a silicon carbide single-crystal substrate doped with p-type impurities. The p-type epitaxial film 2 is a low-concentration p-type drift layer that is doped with a p-type impurity and has a lower impurity concentration than that of the p$^+$-type silicon carbide substrate 1. Hereinafter, the p$^+$-type silicon carbide substrate 1 and the p-type epitaxial film 2 are collectively referred to as a "silicon carbide semiconductor base".

An n$^+$-type drain region 7, an n$^+$-type source region 8, and a p$^+$-type ground region 9 are selectively provided in a surface on a first side of the p-type epitaxial film 2 opposite a second side of the p-type epitaxial film 2 facing the p$^+$-type silicon carbide substrate 1. The n$^+$-type source region 8 and the p$^+$-type ground region 9 are arranged to be in contact with each other and the n$^+$-type drain region 7 is provided apart from the n$^+$-type source region 8 and the p$^+$-type ground region 9.

A gate electrode 13 containing poly-silicon (poly-Si) is provided on the surface of the p-type epitaxial film 2 between the n$^+$-type drain region 7 and the n$^+$-type source region 8, a surface of the n$^+$-type drain region 7, and a surface of the n$^+$-type source region 8 across a gate insulating film 12. The gate insulating film 12 is constituted by an oxide film, a nitride film, or an oxynitride film and may be a single layer or a multilayer.

A reactive layer 15 is provided on the surface of the n$^+$-type drain region 7 to become a drain electrode, and a reactive layer 15 is provided on the surface of the n$^+$-type source region 8 and a surface of the p$^+$-type ground layer 9 to become a source electrode.

Pad electrodes 16 are provided on surfaces of the gate electrode 13 and the reactive layers 15, respectively, and a field oxide film 10 is provided on an outer side of the reactive layers 15 (opposite an inner side of the reactive layers 15 facing the gate electrode 13). A rear electrode 17 is provided on a rear surface of the p$^+$-type silicon carbide substrate 1.

In the gate insulating film 12, fluorine (F$_2$) is implanted in an interface with the silicon carbide semiconductor base by ion implantation. The concentration of fluorine is, for example, equal to or higher than $1\times10^{19}$ atoms/cm$^3$. Accordingly, after a satisfactory interface between the silicon carbide semiconductor base and the gate insulating film 12 is formed, hydrogen or hydroxyl groups terminating the interface state may be replaced with fluorine which is more stable. As a result, deterioration of the MOS interface characteristics in heat treatment at the subsequent process may be prevented. The concentration of fluorine in the gate electrode 13 is equal to or lower than $1\times10^{18}$ atoms/cm$^3$.

A method of manufacturing the MOSFET according to an embodiment is described next. FIGS. 2, 3, 4, 5, 6, 7, 8, and 9 are cross-sectional views of states of the MOSFET according to one embodiment during manufacturing. FIGS. 2 to 9 are cross-sectional views at respective processes for explaining processes 1 to 9 at the time of manufacturing a MOSFET on the (000-1) plane of silicon carbide.

Figure 2:
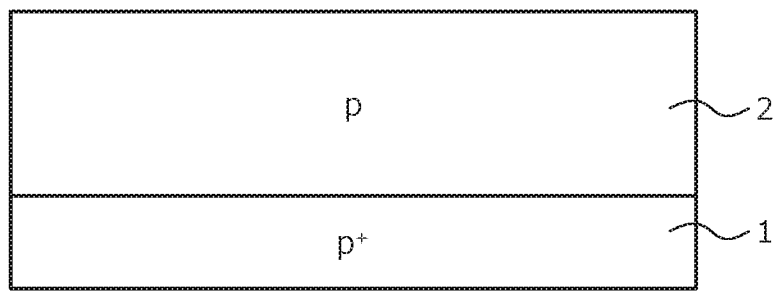
FIGS. 2, 3, 4, 5, 6, 7, 8, and 9 are cross-sectional views of states of the MOSFET according to the embodiment during manufacturing.

First, as depicted in FIG. 2, in a first process, a p-type epitaxial film 2 is grown on a p$^+$-type 4H—SiC (000-1) substrate 1 (a substrate that is 0 to 8 degrees off and preferably may be 0 to 4 degrees off with respect to the (000-1) plane). In one embodiment, the p-type epitaxial film has an acceptor density of $1\times10^{16}$/cm$^3$.

Figure 3:
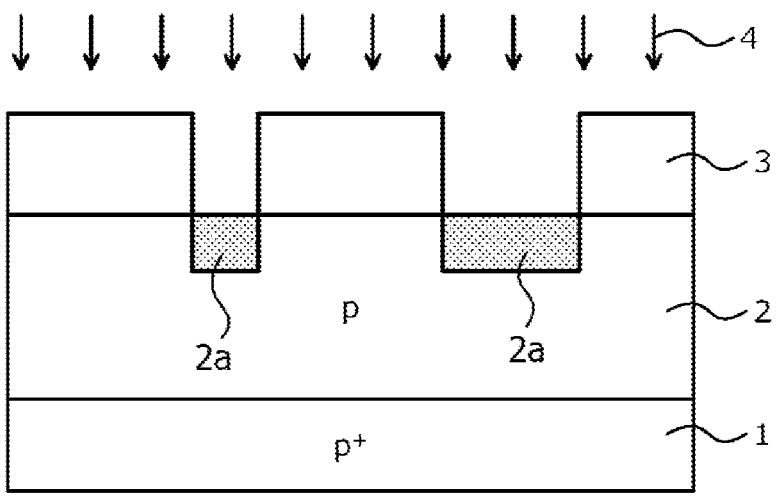

Next, as depicted in FIG. 3, in a second process, a silicon dioxide (SiO$_2$) film is deposited on a surface of the p-type epitaxial film 2. In one embodiment, the SiO$_2$ film is deposited by a low-pressure chemical vapor deposition (CVD) method and is patterned by photolithography to form a mask 3. In one embodiment, the SiO$_2$ film is formed to have a thickness of 1 micrometer. Subsequently, impurities are implanted to obtain a predetermined impurity concentration. In one embodiment, the predetermined impurity concentration is $2\times10^{20}$/cm$^3$. For example, in one embodiment, phosphorus (P) ions 4 are implanted by multistage ion implantation at a substrate temperature of 500 degrees C. and an acceleration energy of 40 keV to 250 keV to obtain an impurity concentration of $2\times10^{20}$/cm$^3$. In FIG. 3, regions 2a in which the phosphorus ions are implanted are depicted as hatched regions 2a.

Figure 4:
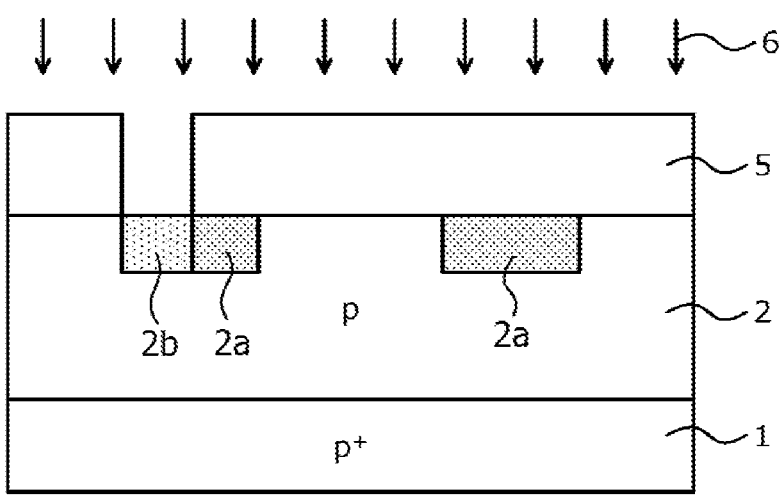

Next, as depicted in FIG. 4, in a third process, the mask 3 is removed and a SiO$_2$ film is deposited on the surface by the low-pressure CVD method and is patterned by photolithography to form a mask 5. In one embodiment, the SiO$_2$ film is deposited to have a thickness of 1 micrometer. Subsequently, impurities are implanted to obtain a predetermined impurity concentration. In one embodiment, the predetermined impurity concentration is a concentration of $2\times10^{20}$/cm$^3$. For example, in one embodiment, aluminum (Al) ions 6 are implanted by multistage ion implantation at a substrate temperature of 500 degrees C. and an acceleration energy of 40 keV to 200 keV to obtain an impurity concentration of $2\times10^{20}$/cm$^3$. In FIG. 4, a region 2b in which the aluminum ions are implanted is a region 2b hatched more lightly than the regions 2a in which the phosphorous ions are implanted.

Figure 5:
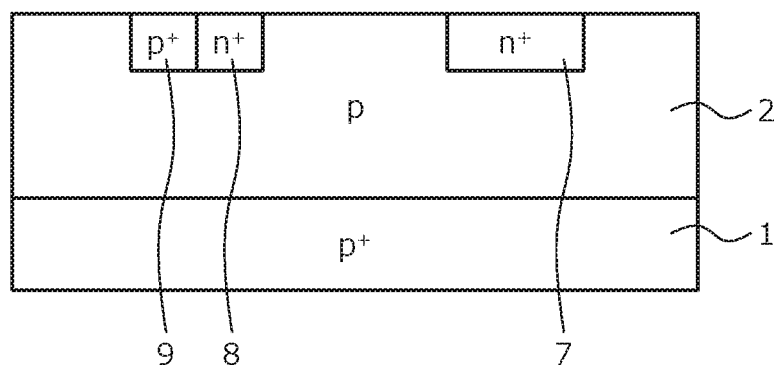

Next, as depicted in FIG. 5, in a fourth process, the mask 5 is removed and activation annealing is performed to form an n$^+$-type drain region 7, an n$^+$-type source region 8, and a p+-type ground region 9. In one embodiment, the activation annealing is performed at 1600 degrees C. for 5 minutes in an argon atmosphere.

Figure 6:
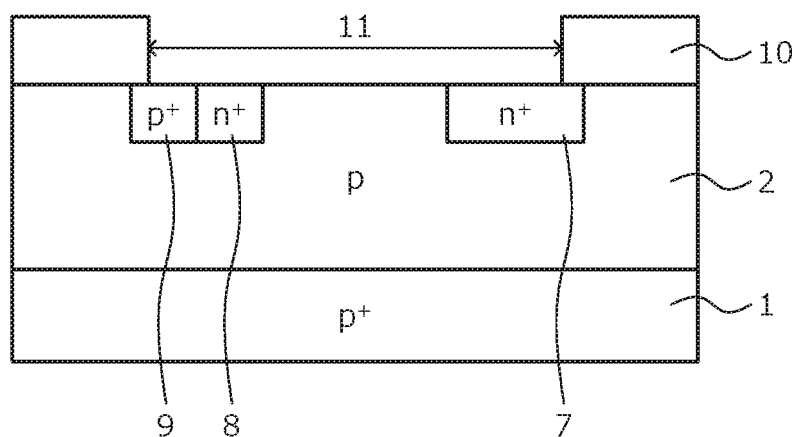

Next, as depicted in FIG. 6, in a fifth process, a field oxide film 10 is deposited by the low-pressure CVD method and a portion of the field oxide film 10 is removed by photolithography and wet etching to form an active region 11. In one embodiment, the field oxide film 10 is formed to have a thickness of 0.5 micrometers.

Figure 7:
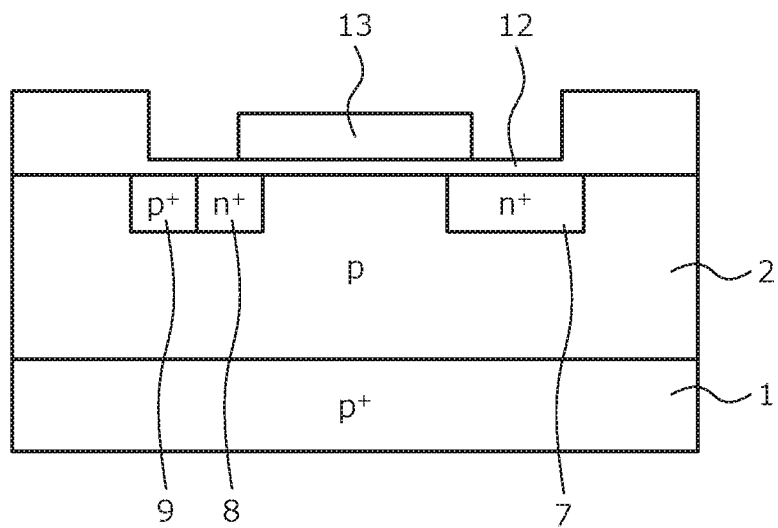

Next, as depicted in FIG. 7, in a sixth process, wet oxidation to form a gate insulating film 12. In one embodiment, the wet oxidation is performed at 1000 degrees C. for 30 minutes. In one embodiment, the gate insulating film 12 is formed to have a thickness of 100 nanometers. Post oxidation annealing (POA) may be performed in an atmosphere containing hydrogen or water vapor after the gate insulating film 12 is formed.

It suffices that the gate insulating film 12 has an interface state terminated by hydrogen or hydroxyl groups, and the gate insulating film 12 may be one obtained by performing dry oxidation, thermal oxynitriding with nitrous oxide ($N_2O$) or nitric oxide (NO), or POA to a deposited film in an atmosphere containing hydrogen or water vapor. The deposition method of the gate insulating film 12 includes embodiments using silane ($SiH_4$) or Tetraethoxysilane ((TEOS) Tetraethyl Orthosilicate $Si(OC_2H_5)_4$) in the CVD method although embodiments are not particularly limited to only these methods.

Thereafter, poly-silicon is deposited on the gate insulating film 12 by the low-pressure CVD method and is patterned by photolithography to form a gate electrode 13. In one embodiment, the poly-silicon is deposited to a thickness of 0.5 micrometers. Subsequently, fluorine ions are implanted. In one embodiment, the fluorine ions are implanted at a room temperature, or between 20 degrees Celsius to 25 degrees Celsius. In one embodiment, the fluorine ions are implanted with an acceleration energy sufficiently low that the fluorine ions do not pass through the gate electrode 13. In one embodiment, the acceleration energy of the fluorine ions is 30 keV, and a peak concentration of the fluorine ions is $1 \times 10^{20}/cm^3$. In one embodiment, the acceleration energy of the fluorine ions is preferably 20 keV to 50 keV. It suffices that the fluorine peak concentration is a concentration at which fluorine may be sufficiently supplied to the interface between the gate insulating film 12 and the silicon carbide semiconductor base in heat treatment, and the peak concentration is preferably $1 \times 10^{19}/cm^3$ to $1 \times 10^{22}/cm^3$.

After the fluorine is implanted, heat treatment is performed in an atmosphere of an inert gas. In one embodiment, the heat treatment is performed at 1000 degrees C. for 10 minutes in a nitrogen ($N_2$) atmosphere. It suffices that the atmosphere of the heat treatment is an inert gas atmosphere and any of nitrogen, helium (He), and argon (Ar) can be used. In addition, embodiments of the invention encompass any temperature and the time of the heat treatment such that the fluorine may be diffused to the interface between the gate insulating film 12 and the silicon carbide semiconductor base. For example, in one embodiment, the temperature may be preferably 800 degrees C. to 1200 degrees C. and the time may be preferably 1 minute to 60 minutes. Within these constraints, in these embodiments, fluorine ions are implanted in the gate electrode 13 and the fluorine is diffused to the interface between the gate insulating film 12 and the silicon carbide semiconductor base by the heat treatment.

Figure 8:
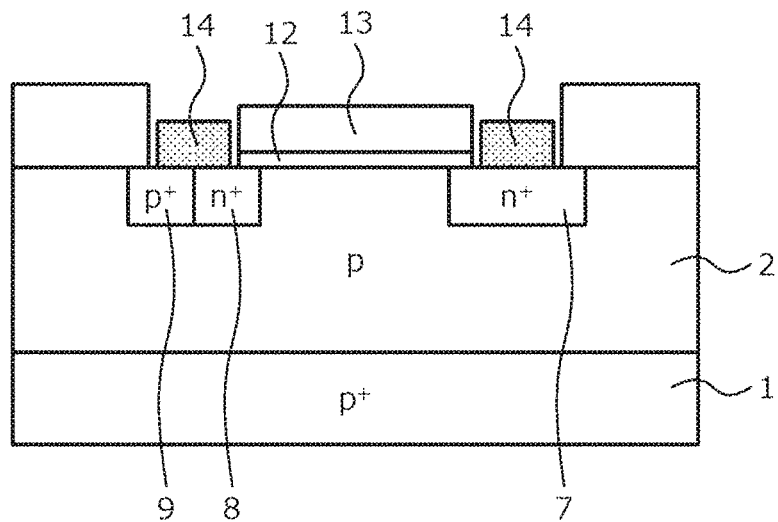

Next, as depicted in FIG. 8, in a seventh process, contact holes are formed by photolithography and hydrofluoric acid (HF) etching on the n+-type drain region 7, the n+-type source region 8, and the p+-type ground region 9, and aluminum having a thickness of 10 nanometers and then nickel (Ni) having a thickness of 60 nanometers are vapor-deposited thereon one on top of the other and are patterned by lift-off to form contact metals 14.

Figure 9:
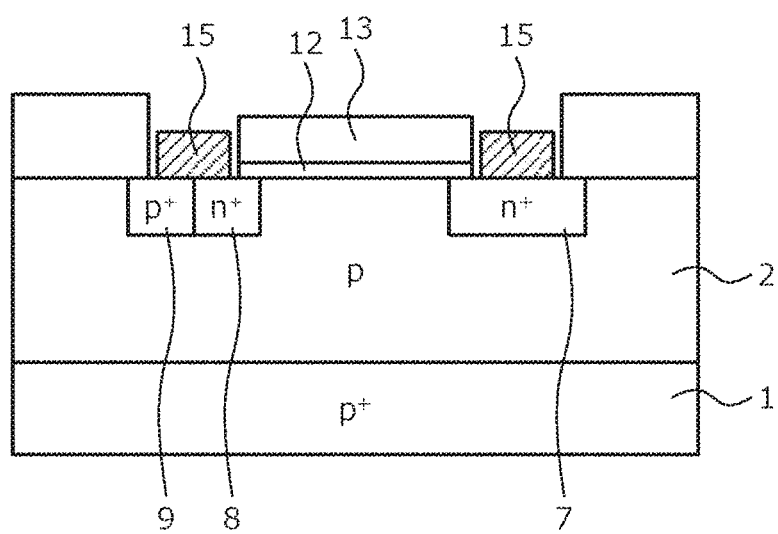

Next, as depicted in FIG. 9, in an eighth process, annealing is performed as ohmic contact annealing to form reactive layers 15 of the contact metals 14 and silicon carbide. In one embodiment, the annealing is performed at 800 to 1000 degrees C. for 2 to 5 minutes.

Next, as depicted in FIG. 1 which is a cross-sectional view of the configuration of the silicon carbide MOSFET, in a ninth process, a conductive metal is vapor-deposited on the surface to form pad electrodes 16 on the gate electrode 13 and on the reactive layers 15. In one embodiment, the conductive metal is aluminum. In one embodiment, the aluminum is vapor-deposited to a thickness of 300 nanometers. In one embodiment, the aluminum is vapor-deposited by photolithography and phosphoric acid ($H_3PO_4$) etching. In addition, the conductive metal, such as aluminum, is vapor-deposited on the rear surface to form a rear electrode 17. In one embodiment, aluminum is deposited on the rear surface to a thickness of 100 nanometers to form the rear electrode.

When characteristics of a silicon carbide MOSFET manufactured by the method of manufacturing a silicon carbide MOSFET depicted in FIGS. 2 to 9 were evaluated, the channel mobility had a high value of about 67 $cm^2/Vs$. Because the channel mobility is high, the interface state density is considered as low.

When a silicon carbide MOSFET was manufactured by a method identical to that of the embodiment except that the ion implantation of fluorine and the following heat treatment were not performed in the sixth process in the embodiment, and characteristics thereof were evaluated, the channel mobility had a low value of about 58 $cm^2/Vs$. It was thus found that high channel mobility is obtained by the ion implantation of fluorine in the gate electrode 13 and the following heat treatment.

Secondary ion mass spectroscopy (SIMS) measurement results of a fluorine concentration in a Poly-Si/$SiO_2$/SiC stack configuration (the gate electrode 13/the gate insulating film 12/the p-type epitaxial film 2, for example) that has high channel mobility obtained by the fluorine ion implantation and the following heat treatment in the MOSFET by are described next.

Figure 10A:
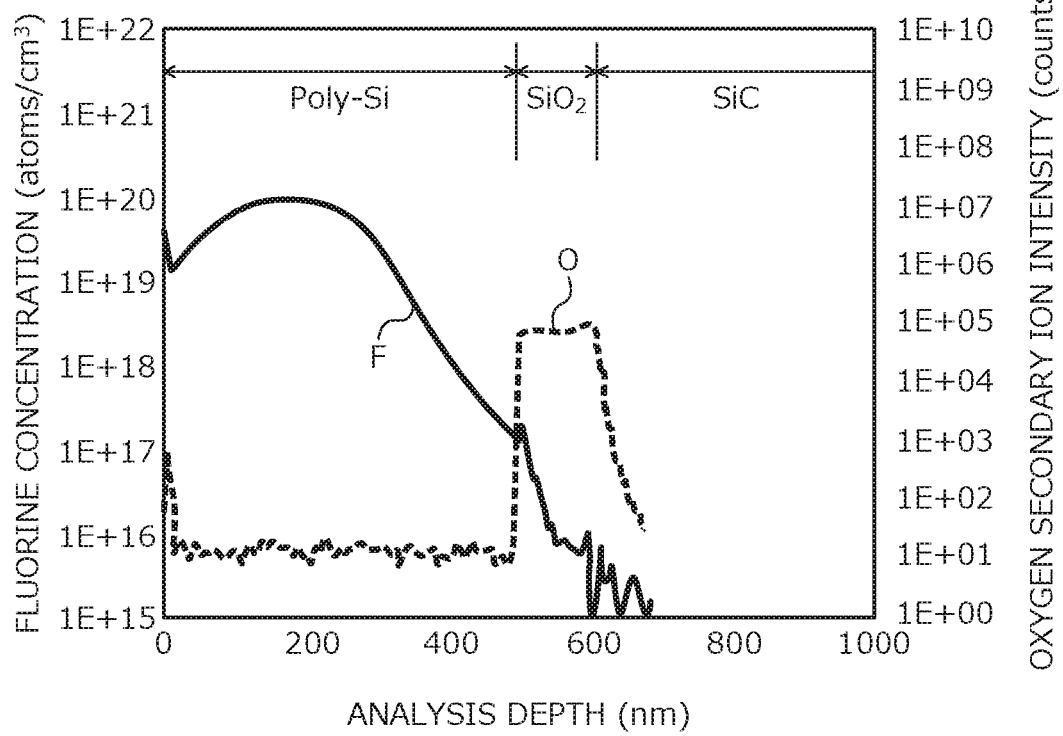
FIG. 10A is a graph depicting a SIMS fluorine-concentration measurement result before heat treatment of a Poly-Si/$SiO_2$/SiC stack configuration in the MOSFET according to the embodiment.
Figure 10B:
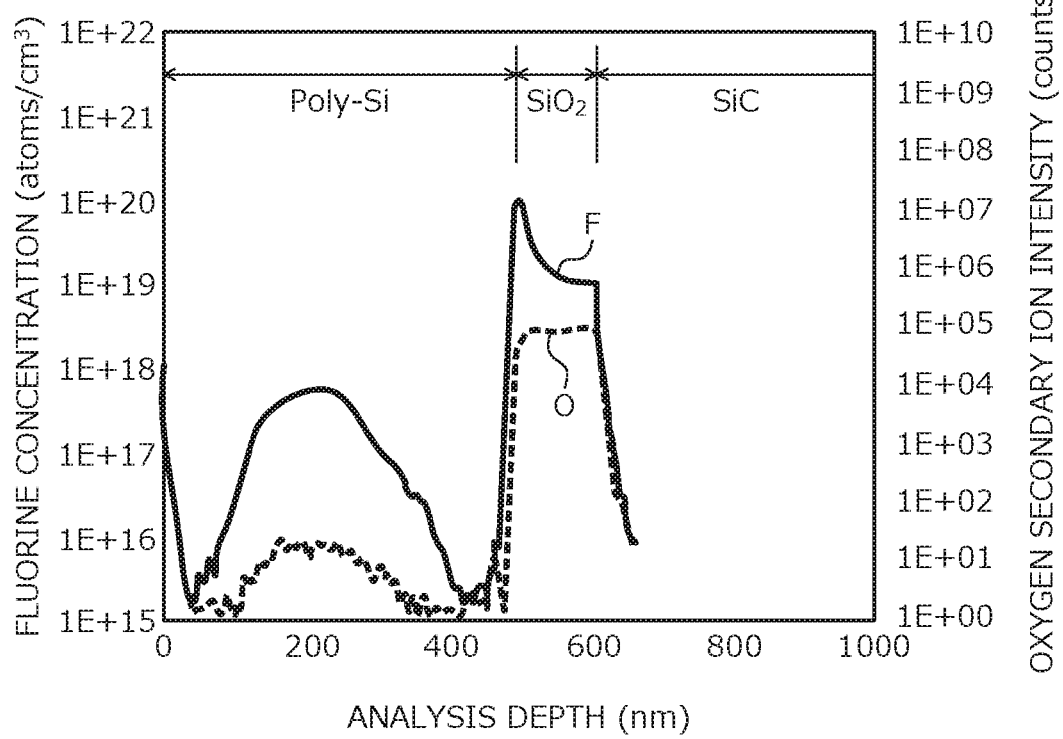
FIG. 10B is a graph depicting a SIMS fluorine-concentration measurement result after the heat treatment of the Poly-Si/$SiO_2$/SiC stack configuration in the MOSFET according to the embodiment.

FIG. 10A is a graph depicting a SIMS fluorine-concentration measurement result before heat treatment of the Poly-Si/$SiO_2$/SiC stack configuration in the MOSFET according to the embodiment. FIG. 10B is a graph depicting a SIMS fluorine-concentration measurement result after the heat treatment of the Poly-Si/$SiO_2$/SiC stack configuration in the MOSFET according to the embodiment. In particular, these are results of SIMS analysis performed on a stack film formed by performing wet oxidation to form the gate insulating film 12 on the p+-type silicon carbide substrate 1 being the (000-1) plane, formation of the gate electrode 13, ion implantation of fluorine, and the following heat treatment according to the sixth process described above.

In FIGS. 10A and 10B, the left vertical axis represents the fluorine concentration where the unit is atoms/$cm^3$, and the right vertical axis represents the oxygen secondary ion intensity where the unit is the total number (counts). The horizontal axis represents the analysis depth (the depth from the gate insulating film 12, for example) where the unit is nanometer. Cesium (Cs) was used as a primary ion species of the SIMS.

In FIGS. 10A and 10B, the secondary ion intensity of O is high around analysis depths from 500 nanometers to 600 nanometers, which is a $SiO_2$ layer. A portion at shallower analysis depths is a Poly-Si layer and a portion at deeper analysis depths is a SiC layer. As depicted in FIG. 10A, the peak concentration of F that has been ion implanted in Poly-Si is about $1\times10^{20}$ atoms/cm³ before heat treatment. These ions are diffused to $SiO_2$ by heat treatment, so that the peak concentration of F is reduced to be equal to or lower than $1\times10^{18}$ atoms/cm³ as depicted in FIG. 10B. The concentration of F in $SiO_2$ after the heat treatment is equal to or higher than $1\times10^{19}$ atoms/cm³ and it was confirmed from 10B that a high concentration of fluorine was also present in a $SiO_2$/SiC interface.

The fluorine concentration in the $SiO_2$/SiC interface may be preferably equal to or higher than $1\times10^{19}$ atoms/cm³. This is because the interface state cannot be terminated sufficiently when the fluorine concentration is lower than $1\times10^{19}$ atoms/cm³.

While the (000-1) substrate (0 to 8-degree off substrate) of a 4H—SiC crystal structure is used in the embodiment described above, effects of identical tendency are also achieved with substrates of other plane orientations such as a (0001) substrate or a (11-20) substrate of the 4H—SiC crystal structure.

Although an example of the method of manufacturing a lateral MOSFET using the p⁺-type semiconductor substrate 1 as a silicon carbide MOSFET has been described, the present invention is not limited hereto. The present invention is further applicable to a semiconductor device having a structure for high voltages such as a vertical MOSFET using an n⁺-type semiconductor substrate, or a semiconductor device having a trench gate or complicated MOS gate structure and these semiconductor devices may also provide identical effects. Therefore, the present invention may be applied to methods of manufacturing various semiconductor devices without departing from the scope of the present invention described in claims.

Figure 11:
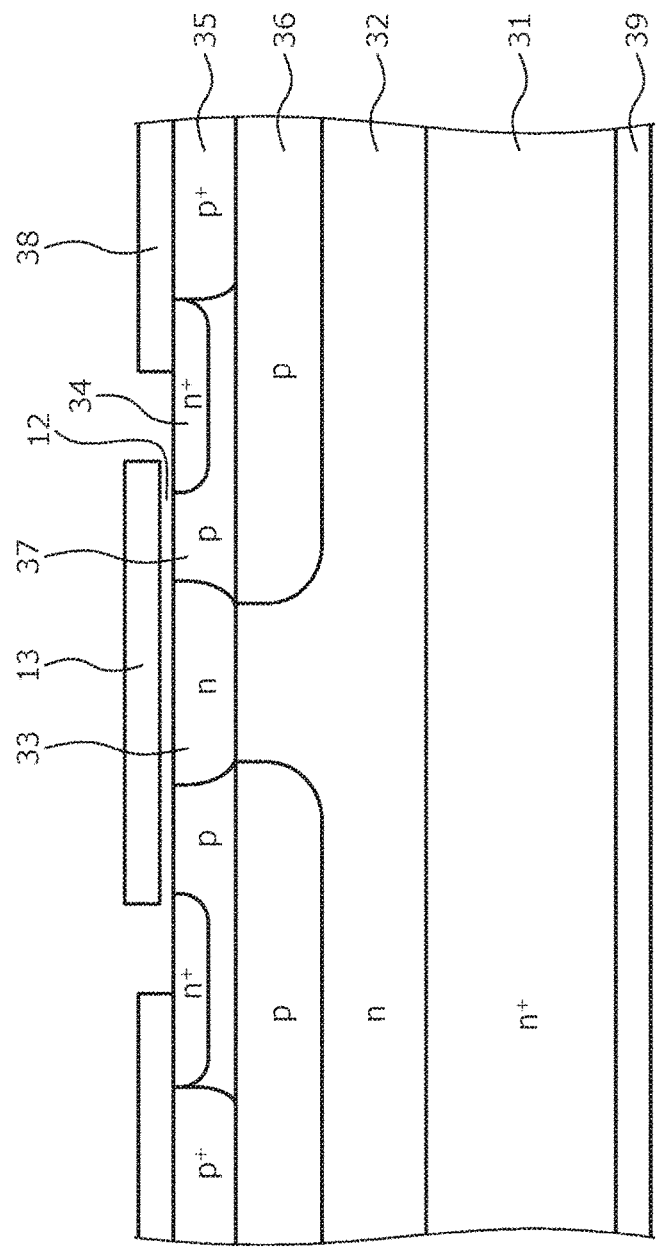
FIG. 11 is a cross-sectional view of an example of a semiconductor device having a complicated MOS gate structure according to the present invention.

The complicated MOS gate structure is, for example, a device structure that forms channels near the surface of a SiC epitaxial substrate when in an on-state. FIG. 11 is a cross-sectional view of an example of a semiconductor device having a complicated MOS gate structure according to an embodiment of the present invention. As depicted in FIG. 11, a vertical MOSFET has an n-type epitaxial layer 32 formed on the front surface of an n⁺-type silicon carbide substrate 31.

The n-type epitaxial layer 32 has an impurity concentration lower than that of the n⁺-type silicon carbide substrate 31. Plural p-type regions 36 are selectively formed in the n-type epitaxial layer 32. The p-type regions 36 are exposed on a surface on a first side of the n-type epitaxial layer 32 opposite a second side of the n-type epitaxial layer 32 facing the n⁺-type silicon carbide substrate 31. A p-type SiC layer 37 having a lower concentration than the p-type regions 36 is formed on the surfaces of the n-type epitaxial layer 32 and the p-type regions 36. An n-type region 33 that penetrates the p-type SiC layer 37 in the depth direction and reaches the n-type epitaxial layer 32 is formed in the p-type SiC layer 37 on the n-type epitaxial layer 32 where the p-type regions 36 are not formed. The n-type epitaxial layer 32 and the n-type region 33 are an n-type drift region. The impurity concentration of the n-type region 33 may be preferably higher than that of the n-type epitaxial layer 32.

An n⁺-type source region 34 and a p⁺-type contact region 35 are formed to be adjacent to each other in the p-type SiC layer 37. The n⁺-type source region 34 and the p⁺-type contact region 35 are exposed on a surface on a first side of the p-type SiC layer 37 opposite a second side of the p-type SiC layer 37 facing the p-type regions 36. The n⁺-type source region 34 is formed apart from the n-type region 33. The p⁺-type contact region 35 is positioned on a first side of the n⁺-type source region 34 opposite a second side of the n⁺-type source region 34 facing the n-type region 33. The impurity concentration of the p⁺-type contact region 35 is higher than that of the p-type SiC layer 37. A portion of the p-type SiC layer 37 other than the n⁺-type source region 34, the p⁺-type contact region 35, and the n-type region 33 forms a p-type base region along with the p-type regions 36.

A source electrode 38 is formed on the surfaces of the n⁺-type source region 34 and the adjacent p⁺-type contact region 35. The gate electrode 13 is formed on the surfaces of the p-type SiC layer 37 and the n-type region 33 between the adjacent n⁺-type source regions 34, with the gate insulating film 12 interposed therebetween. The gate electrodes 13 are electrically insulated from the source electrodes 38 by an interlayer insulating film (not depicted). A drain electrode 39 being in contact with the n⁺-type silicon carbide substrate 31 is formed on the rear surface of the n⁺-type silicon carbide substrate 31. By causing the concentrations of fluorine in the gate insulating film 12 and the silicon carbide semiconductor base (a base including the n⁺-type silicon carbide substrate 31 and the n-type epitaxial layer 32) to be equal to or higher than $1\times10^{19}$ atoms/cm³, a semiconductor device having a complicated MOS gate structure in which the interface state density is effectively reduced and a high channel mobility is realized may be fabricated.

As described above, according to the silicon carbide semiconductor device of the embodiment, ions of fluorine are implanted in a gate electrode and the fluorine is diffused to an interface between a gate insulating film and a silicon carbide semiconductor base by heat treatment. Accordingly, hydrogen or hydroxyl groups terminating the interface state may be replaced with more stable fluorine and deterioration of the MOS interface characteristics due to heat treatment at a subsequent process may be prevented. Therefore, the silicon carbide semiconductor device according to the embodiment can effectively reduce the interface state density and realize high channel mobility.

The concentration of fluorine in the interface between the gate insulating film and the silicon carbide semiconductor base is equal to or higher than $1\times10^{19}$ atoms/cm³. With this concentration of fluorine, hydrogen or hydroxyl groups terminating the interface state can be sufficiently replaced with fluorine.

The acceleration energy of fluorine ion implantation is 20 keV to 50 keV. This prevents the fluorine from passing through the gate electrode at the time of ion implantation. Furthermore, the peak concentration of fluorine at the time of ion implantation is $1\times10^{19}$/cm³ to $1\times10^{22}$/cm³. Therefore, the fluorine may be sufficiently supplied to the interface between the gate insulating film and the silicon carbide semiconductor base by heat treatment.

According to a silicon carbide semiconductor device and a method of manufacturing a silicon carbide semiconductor device of the present invention, effects are obtained where the interface state density is effectively reduced and a high channel mobility is realized.

As described, the silicon carbide semiconductor device and the method of manufacturing a silicon carbide semiconductor device are useful for high voltage semiconductor devices used in power converting equipment and power supply devices such as in various industrial machines.

In the present specification and claims, the term "any one or a plurality of" a group of elements means any one element from the group, or any combination of two or more elements in the group. For example, the term "any one of an oxide film, a nitride film, and an oxynitride film" means one oxide film, one nitride film, or one oxynitride film, or any combination of oxide film, nitride film, and oxynitride film.

Although the invention has been described with respect to specific embodiments for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device comprising:
   a silicon carbide semiconductor base of a first conductivity type;
   a gate insulating film provided on a front surface of the silicon carbide semiconductor substrate and including any one or a plurality of an oxide film, a nitride film, and an oxynitride film; and
   a gate electrode containing poly-silicon and provided on the gate insulating film, wherein
   the gate insulating film has an interface state terminated by hydrogen or hydroxyl groups, wherein the hydrogen or the hydroxyl groups terminating the interface state is replaced with fluorine, and
   a concentration of fluorine in the silicon carbide semiconductor device has a first peak and a second peak, the first peak is in the gate electrode and is equal to or lower than $1\times10^{18}$ atoms/cm$^3$ and the second peak is in the gate insulating film and is equal to or higher than $1\times10^{19}$ atoms/cm$^3$.

2. The silicon carbide semiconductor device according to claim 1, wherein the concentration of fluorine in the gate insulating film at an interface with the gate electrode is equal to or higher than $1\times10^{20}$ atoms/cm$^3$.

3. The silicon carbide semiconductor device according to claim 1, wherein the gate insulating film has a thickness of at least 100 nm.

4. A method of manufacturing a silicon carbide semiconductor device, the method comprising:
   forming on a front surface of a silicon carbide semiconductor base, a gate insulating film that includes any one or a plurality of an oxide film, a nitride film, and an oxynitride film;
   forming on the gate insulating film, a gate electrode containing poly-silicon;
   ion implanting fluorine in the gate electrode; and
   diffusing the fluorine to the gate insulating film and an interface between the gate insulating film and the silicon carbide semiconductor base by heat treatment,
   wherein post-oxidation annealing in an atmosphere containing hydrogen or water vapor is performed after the gate insulating film is formed.

5. The method according to claim 4, wherein ion implanting the fluorine is performed at an acceleration energy of 20 keV to 50 keV and a peak concentration of the fluorine is $1\times10^{19}$/cm$^3$ to $1\times10^{22}$/cm$^3$.

* * * * *